United States Patent
Oron et al.

(10) Patent No.: US 9,577,125 B2
(45) Date of Patent: Feb. 21, 2017

(54) COLLOIDAL SEMICONDUCTING STRUCTURE

(71) Applicant: Yeda Research and Development Co. Ltd., Rehovot (IL)

(72) Inventors: Dan Oron, Rehovot (IL); Zvi Deutsch, Rehovot (IL); Lior Neeman, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 162 days.

(21) Appl. No.: 14/258,696

(22) Filed: Apr. 22, 2014

(65) Prior Publication Data
US 2014/0312302 A1    Oct. 23, 2014

Related U.S. Application Data

(60) Provisional application No. 61/814,621, filed on Apr. 22, 2013.

(51) Int. Cl.
*H01L 31/06*    (2012.01)
*H01L 31/0352*    (2006.01)
(Continued)

(52) U.S. Cl.
CPC ....... *H01L 31/035218* (2013.01); *C09K 11/54* (2013.01); *C09K 11/88* (2013.01);
(Continued)

(58) Field of Classification Search
CPC .......... H01L 31/035218; H01L 31/06; H01L 31/02322; H01L 31/055; H01L 31/04; H01L 33/18; H01L 31/101; C09K 11/88; Y02E 10/50; Y02E 10/549
(Continued)

(56) References Cited

U.S. PATENT DOCUMENTS 3,833,894 A * 9/1974 Aviram ............... B82Y 10/00
257/632
4,903,101 A * 2/1990 Maserjian ............ B82Y 20/00
250/370.14
(Continued)

FOREIGN PATENT DOCUMENTS

CN    102268259 A    12/2011

OTHER PUBLICATIONS

Assaf Avidan et al "Large Blue Shift of the Biexciton State in Tellurium Doped CdSe Collidal Quantum Dot" NANO Letters 8:8: 2384-2387 (Jun. 2008).
(Continued)

*Primary Examiner* — David Vu
*Assistant Examiner* — Mouloucoulaye Inoussa
(74) *Attorney, Agent, or Firm* — Browdy and Neimark, PLLC

(57) ABSTRACT

The present invention is based on a unique design of a novel structure, which incorporates two quantum dots of a different bandgap separated by a tunneling barrier. Upconversion is expected to occur by the sequential absorption of two photons. In broad terms, the first photon excites an electron-hole pair via intraband absorption in the lower bandgap dot, leaving a confined hole and a relatively delocalized electron. The second absorbed photon can lead, either directly or indirectly, to further excitation of the hole, enabling it to then cross the barrier layer. This, in turn, is followed by radiative recombination with the delocalized electron.

23 Claims, 8 Drawing Sheets

(51) Int. Cl.
    *C09K 11/88* (2006.01)
    *H01L 31/0232* (2014.01)
    *H01L 31/055* (2014.01)
    *C09K 11/54* (2006.01)

(52) U.S. Cl.
    CPC ...... *H01L 31/02322* (2013.01); *H01L 31/055* (2013.01); *Y02E 10/52* (2013.01)

(58) Field of Classification Search
    USPC .................................. 257/13, 14; 438/97
    See application file for complete search history.

(56) References Cited

U.S. PATENT DOCUMENTS

| | | | | |
|---|---|---|---|---|
| 2003/0066998 | A1* | 4/2003 | Lee | B82Y 10/00 257/19 |
| 2004/0118448 | A1* | 6/2004 | Scher | B82Y 10/00 136/252 |
| 2006/0140240 | A1* | 6/2006 | Chen | A61K 49/0067 372/69 |

OTHER PUBLICATIONS

S. Baluschev et al "Up-Conversion Fluorescence: Noncoherent Excitation by Sunlight" Physical Review Letters 97: 1439031-3 (Oct. 2006).
David Battaglia et al "Coupled and Decoupled Dual Quantum Systems in One Semiconductor Nanocrystal" Journal of American Chemical Society. 127:10889-10897 (Jul. 2005).
John-Christopher Boyer et al "Absolute quantum yield measurements of colloidal NaYF4: Er3+, Yb3+ upsonverting nanoparticles" Nanoscale 2:1417-1419 (May 2010).
Luigi Carbone et al "Synthesis and Micrometer-Scale Assembly of Colloidal CdSe/CdS Nanords Prepared by a Seeded Growth Approach" Nano Letters. 7: 2942-2950 (Jul. 2007).
Emory M. Chan et al "Combiinatorial Discovery of Lanthanide-Doped Nanocrystals with Spectrally Pure Unconverted Emission" Nano Letters. 12:3839-3845 (Jun. 2012).
Guanying Chen et al "Intense Visible and Near-Infrared Upconversion Photoluminescence in Colloidal LiYF4:Er3+ Nanocrystals under Excitation at 1490nm" ACS NANO. 5:6:4981-4986 (May 2011).
Yuen Yap Cheng et al "Improving the light-harvesting of amorphous silicon solar cell with photochemical upconversion" Energy and Environmental Science 5:6953-6959 (Feb. 2012).
Hyeonsik M. Cheong et al "Photoluminescence up-conversion in GaAs/AlxGa1-xAs heterostructures" Physical Review B. 58:8:R4254-R4257 (Aug. 1998).
Zvicka Deutsch et al "Two-Color Antibrunching from Band-Gap Engineered Colloidal semiconductor Nanocrystals" Nano letters 12:2948-2952 (Apr. 2012).
J.De Wild et al "Upconverter solar cells: materials and applications" Energy and Environmental Science. 4:4835-4848 (Jun. 2011).
Eva A. Dias et al "Single Dot Spectroscopy of Two-Color Quantum Dot/Quantum Shell Nanostructures" The Journal of Physical Chemistry C 112:14229-14232 (Jun. 2008).
Markus Haase et al "Upconverting Nanoparticles" Angewandte Chemie International Edition. 50:5808-5829 (2011).
Wolfram Heimbrodt et al " Giant anti-Strokes photoluminescence from semimagnetic heterostructures" 60:24 R16 326-R16 329 (Dec. 1999).
N. Menyuk et al "NaYF4: Yb,Er—an efficient upconversion phosphor" Applied physics 21:4:159-161 (Aug. 1972).
C. A. Parker et al "Sensitised Anti-Strokes Delayed Fluorescence" Proceedings of the Royal Society of Chemical of London 147:386-387 (Dec. 1962).
M. Potemski et al "Auger Recombination within Landau Levels in a Two-Dimensional electron Gas" Physical Review Letters 66:17:2239-2242 (Apr. 1991).
W. Seidel et al "High-Efficiency Energy Up-Conversion by an "Auger Fountain" at an InP-AllnAs Types-II Heterojunction" Physical Review Letters 73:17:2356-2359 (Oct. 1994).
William Shockley et al "Detailed Balance Limited of Efficiency of pn Junction Solar Cells" Journal of Applied Physics 32:510-519 (Mar. 1961).
Tanya N. Singh-Rachford et al "Photon upconversion based on sensitized triplet-triplet annihilation" Coordination Chemistry Reviews 254: 2560-2573 (Feb. 2010).
Dmitri V. Talapin et al "Seeded Growth of Highly luminescent SdSe/CdS Nanoheterostructures with Rod and Tetrapod Morphologies" Nano Letters 7:10:2951-2959 (Aug. 2007).
Feng Wang et al "Upconversion nanoparticles in biological labeling, imaging, and therapy" Analyst 135:1839-1854 (Apr. 2010).
U. Woggon et al "Confined biexcitons in CuBr quantum dots" Journal of Luminescence 59:135-145 (Mar. 1994).
Shiwei Wu et al "Non-blinking and photostable upconverted luminescence from single lanthanide-doped nanocrystals" PNAS 106: 10917-10921 (May 2009).
Guichuan Xing et al "Ultralow-Threshold Two-Photon Pumped Amplified Spontaneous Emission and Lasing from Seeded CdSe/CdS Nanorod Heterostructures" ACS Nano 6:12: 10835-10844 (Nov. 2012).
Y. Yang et al "Semiconductor infrared up-conversion devices" Progress in Quantum Electronics 35:77-108 (May 2011).
Jing Zhou et al "Upconversion nanophosphors for small-animal imaging" Chem. Soc. Rev. 41:1323-1349 (Oct. 2011).
Wenqiang Zou et al "Broadband dye-sensitized upconversion of near-infrared light" Nature photonics 6:560-564 (Jul. 2012).

* cited by examiner

COLLOIDAL SEMICONDUCTING STRUCTURE

TECHNOLOGICAL FIELD

The present invention relates generally to colloidal semiconducting structures.

REFERENCES

References considered to be relevant as background to the presently disclosed subject matter are listed below:
1. Wang, F., Banerjee, D., Liu, Y., Chen, X. & Liu, X. Upconversion nanoparticles in biological labeling, imaging, and therapy. *Analyst* 135, 1839-54 (2010).
2. Zhou, J., Liu, Z. & Li, F. Upconversion nanophosphors for small-animal imaging. *Chem. Soc. Rev.* 41, 1323-49 (2012).
3. De Wild, J., Meijerink, a., Rath, J. K., Van Sark, W. G. J. H. M. & Schropp, R. E. I. Upconverter solar cells: materials and applications. *Energy Environ. Sci.* 4, 4835 (2011).
4. Menyuk, N. $NaYF_4$: Yb,Er—an efficient upconversion phosphor. *Appl. Phys. Lett.* 21, 159 (1972).
5. Shockley, W. & Queisser, H. J. Detailed balance limit of efficiency of p-n junction solar cells. *J. Appl. Phys.* 32, 510 (1961).
6. Wu, S. et al. Non-blinking and photostable upconverted luminescence from single lanthanide-doped nanocrystals. *Proc. Natl. Acad. Sci. U.S.A.* 106, 10917-21 (2009).
7. Chan, E. M. et al. Combinatorial discovery of lanthanide-doped nanocrystals with spectrally pure upconverted emission. *Nano Lett.* 12, 3839-45 (2012).
8. Zou, W., Visser, C., Maduro, J. A., Pshenichnikov, M. S. & Hummelen, J. C. Broadband dye-sensitized upconversion of near-infrared light. *Nat. Photonics* 6, 560-564 (2012).
9. Baluschev, S. et al. Up-conversion fluorescence: noncoherent excitation by sunlight. *Phys. Rev. Lett.* 97, 7-9 (2006).
10. Cheng, Y. Y. et al. Improving the light-harvesting of amorphous silicon solar cells with photochemical upconversion. *Energy Environ. Sci.* 5, 6953 (2012).
11. Singh-Rachford, T. N. & Castellano, F. N. Photon upconversion based on sensitized triplet-triplet annihilation. *Coord. Chem. Rev.* 254, 2560-2573 (2010).
12. Deutsch, Z., Schwartz, O., Tenne, R., Popovitz-Biro, R. & Oron, D. Two-color antibunching from band-gap engineered colloidal semiconductor nanocrystals. *Nano Lett.* 12, 2948-52 (2012).
13. Yang, Y., Zhang, Y. H., Shen, W. Z. & Liu, H. C. Semiconductor infrared up-conversion devices. *Prog. Quantum Electron.* 35, 77-108 (2011).
14. Seidel, W., Titkov, A., André, J., Voisin, P. & Voos, M. High-efficiency energy up-conversion by an "Auger fountain" at an InP—AlInAs type-II heterojunction. *Phys. Rev. Lett.* 73, 2356-2359 (1994).
15. Avidan, A. & Oron, D. Large blue shift of the biexciton state in tellurium doped CdSe colloidal quantum dots. *Nano Lett.* 8, 2384-7 (2008).
16. Carbone, L. et al. Synthesis and micrometer-scale assembly of colloidal CdSe/CdS nanorods prepared by a seeded growth approach. *Nano Lett.* 7, 2942-50 (2007).
17. Boyer, J.-C., van Veggel, F. C. J. M. Absolute quantum yield measurements of colloidal $NaYF_4$:$Er^{3+}$,$Yb^{3+}$ upconverting nanoparticles, *Nanoscale* 2, 1417-1419 (2010).
18. Chen, G., Ohulchanskyy, T. Y., Kachynski, A., Agren, H., Prasad, P. N. Intense visible and near-infrared upconversion photoluminescence in colloidal $LiYF_4$:$Er^{3+}$ nanocrystals under excitation at 1490 nm, *ACS Nano* 5, 4981-4986 (2011).
19. Xing, G., Liao, Y., Wu, X., Chakrabortty, S., Liu, X., Yeow, E. K. L., Chan, Y., Sum, T. C., Ultralow-threshold two-photon pumped amplified spontaneous emission and lasing from seeded CdSe/CdS nanorod heterostructures, *ACS Nano* 6, 10835-10844 (2012).
20. Battaglia, D., Blackman, B., Peng, X., Coupled and decoupled dual quantum systems in one semiconductor nanocrystal, *Journal of the American Chemical Society* 127, 10889-97 (2005).
21. Dias, E. A., Grimes, A. F., English, D. S., Kambhampati, P., Single Dot Spectroscopy of Two-Color Quantum Dot/Quantum Shell Nanostructures, *Journal of Physical Chemistry C* 112, 14229-14232 (2008).

Acknowledgement of the above references herein is not to be inferred as meaning that these are in any way relevant to the patentability of the presently disclosed subject matter.

BACKGROUND OF THE INVENTION

Luminescence upconversion nanocrystals capable of converting two low energy photons into a single photon at a higher energy are sought after for a variety of applications, including bioimaging [1,2] and photovoltaic light harvesting [3].

GENERAL DESCRIPTION

Currently available systems capable of converting two low energy photons into a single photon at a higher energy, based on rare-earth doped dielectrics [4], are limited in both tunability and absorption cross section. The present invention provides an upconversion system colloidal with multiple quantum dots as an alternative nanocrystalline upconversion system, possibly combining the stability of an inorganic crystalline structure with the spectral tunability afforded by quantum confinement. By tailoring its composition and morphology, a semiconducting structure is formed, where excited electrons are delocalized over the entire structure, as well as at least a double potential well for holes. Upconversion occurs by excitation of an electron in the lower energy transition, followed by intraband absorption of the hole, allowing it to cross the barrier to a higher energy state. An overall conversion efficiency of 0.1% per double excitation event at a saturation intensity of about 10 $kW/cm^2$ can be achieved using one possible configuration of the structure of the present invention. The present invention exploits intraband absorption by hot carriers to generate a single high energy exciton out of several low energy excitons in multicolor emitting quantum dots (QDs). This photon upconversion structure opens a broad range of applications in photonics for 'designer' colloidal QD heterostructures. The ability to upconvert two low energy photons into a single higher energy photon is of significant importance in many fields. In biomedical imaging, upconversion enables spatially resolved imaging in a scattering specimen. In photovoltaic devices upconversion could be used as a potential method for surpassing the Shockley-Queisser efficiency limit [5] by utilization of photons having energies below the band gap of the absorber. Efficient room-temperature upconversion is, however, generally very difficult to achieve, and typically requires significant electromagnetic field intensities, such as those achieved by focusing coherent laser radiation. Indeed, coherent conversion processes, in particular second harmonic or sum frequency generation, are commonly used to upconvert laser light. However, as decoherence processes are extremely rapid, upconversion at low illumination intensities is much more difficult to achieve. Efficient upconversion requires the existence of a long-lived metastable state, which can be further promoted to generate a higher energy emission. The prototypical system for achieving this is rare-earth doped glasses, in which a variety of such states are available. As it relies on atomic lines, rare-earth based upconversion can also be realized in nanocrystals [6]. Despite recent progress, using, for example, dopant blends [7] and hybrid organic-inorganic systems [8], this system suffers from low color tunability and relatively low absorption cross sections. Another alternative system for upconversion is triplet-triplet annihilation [9-11], whereby two molecules excited to a long-lived triplet state transfer their excitation to a higher energy singlet state of another molecule. While tunable via choice of the organic molecule, this system suffers from several drawbacks, such as a limited availability of near-infrared fluorophores and photobleaching.

The present invention is based on a unique design of a novel structure, which incorporates two quantum dots of a different bandgap separated by a tunneling barrier. Upconversion is expected to occur by the sequential absorption of two photons. In broad terms, the first photon excites an electron-hole pair via intraband absorption in the lower bandgap dot, leaving a confined hole and a relatively delocalized electron. The second absorbed photon can lead, either directly or indirectly, to further excitation of the hole, enabling it to then cross the barrier layer. This, in turn, is followed by radiative recombination with the delocalized electron.

The novel colloidal semiconducting structure of the present invention may be a new type of bulk-like system which exhibits efficient luminescence upconversion. In some embodiments, different types of nanocrystals take on the role of either the host lattice or the individual dopant ions in conventional rare-earth based upconversion materials, acting as effective donors and emitters, respectively. This novel structure is configured to combine low temperature sensitivity and reduced saturation intensity of colloidal quantum dots with the versatility of compositional tuning as in a doped solid. Luminescence upconversion, the incoherent conversion of two (or more) low energy photons to a single high energy photon is of significant interest for various applications, in particular light detection and photovoltaics. Luminescence upconversion is an incoherent process whereby two or more low energy photons are absorbed by a quantum system and converted, via the use of a metastable intermediate state, to a single photon having an energy exceeding that of all the absorbed photons. Efficient luminescence upconversion is difficult to achieve because intermediate excited states usually tend to relax to the ground state. Upconversion thus requires a 'protected' intermediate state which can be further pumped to an emissive higher excited state. In the present invention, the intermediate state may be obtained by an appropriate selection of the materials used in the novel configuration of the present invention for example by reducing spatial overlap between the electron and the hole wavefunction or by the use of forbidden gap or indirect gap donors. In a specific and non-limiting example, the spatial overlap between the electron and the hole wavefunction is reduced by selecting a conduction band alignment between the 'donor' and the 'barrier' to be type-II or quasi-type-II (i.e. where one single particle energy is localized in the core and the other is localised over the whole nanocrystal region.

An upconversion system is usually characterized by two important parameters: the upconversion efficiency and the saturation intensity. The efficiency is defined as the ratio between the number of upconverted photons and the number of absorbed photon pairs (or triplets). The saturation intensity is the required optical power density for achieving the maximal conversion efficiency. Typical efficiencies for bulk (or liquid) systems are in the few percent regime, at saturation intensities of 0.1-1 kW/cm$^2$. For nanocrystalline systems efficiencies are typically lower, around (or somewhat less than) 1%. The structure of the present invention provides a broad absorption range and a means for tuning the emission wavelength. This enables tailoring it to the particular desired application. Therefore, there is provided a colloidal semiconducting structure comprising two quantum dots of different bandgap physically coupled to one another and spaced apart via a barrier material. The first of the quantum dots is light emitting while the second of the quantum dots is capable of responding to photoexcitation by creation of excited charge carriers. The materials of the quantum dots and of the barrier are selected to provide an appropriate band alignment such that at least a double potential well is formed, splitting carriers into two spatially distinct regions, while the oppositely charged carrier is localized in a single region or further delocalized throughout the entire structure, such that the quantum dots are capable, upon photoexcitation of both, to emit in at least one of two distinct spectra. In some embodiments, the materials of the first and second quantum dots are selected such that the material of the first quantum dot has a higher energy band gap than the energy band gap of the second quantum dot. Luminescence upconversion is achieved by shuttling hot holes from the low bandgap dot to the high bandgap one. In this connection, it should be understood that dot-based systems are operable at room temperature, since high effective carrier densities are already achieved at the level of a single excitation per dot, and due to significant differences in recombination pathways. In some embodiments, at least one of the first and second quantum dots comprises at least one nanoparticle.

In some embodiments, the first and second quantum dots are made of different materials.

In some embodiments, the second quantum dot is emitting.

In some embodiments, at least one of the first and second quantum dots is embedded in the barrier material. The second quantum dot may be embedded in the barrier material forming a first arrangement which is then coated by the first quantum dot.

In some embodiments, the barrier has a rod-like shape. The second particle may be then located at the tip of the rod-like barrier. The barrier may comprise nanorods made of at least one of CdS, ZnSe and CdSeS alloy. In this case, two dots having different band gaps are grown at the two edges of a nanorod serving as the barrier material. In some embodiments, at least one of the first and second quantum dot materials comprises semiconducting nanocrystals.

In some embodiments, the present invention provides a new structure for luminescence upconversion in semiconductor nanocrystals (NCs), enabling the manufacture of complex multicomponent systems.

In some embodiments, the structure can be obtained via self-assembly or layer-by-layer growth techniques.

In some embodiments, the structure comprises a compound semiconductor NC. At least one of the semiconducting nanocrystals may comprise Group II-VI compound semiconductor nanocrystals, Group III-V or IV-VI compound semiconductor nanocrystals.

In some embodiments, at least one of the first and second quantum dot is made of one or more indirect band gap materials such as Si.

In some embodiments, the second quantum dot comprises at least one of Te-doped CdSe, CdTe, ZnTe, Te-doped ZnSe, PbS, $Ag_2S$, $CuInS_2$, InAs, InSb, PbSe.

In some embodiments, the first quantum dot comprises at least one of CdZnSe and CdSe, ZnSe.

In some embodiments, at least one of the size of at least one of the first and second nanoparticles and relative concentration of the materials is selectable to provide tunability of absorption edge and luminescence color.

In some embodiments, the first and second quantum dots are coupled via Coulomb-mediated exciton-exciton interactions.

In some embodiments, the first and second quantum dots are coupled via Auger recombination or direct intraband absorption.

In some embodiments, each of the first and second quantum dots is a single particle.

In some embodiments, each of said first and second quantum dots forms a layer respectively creating a multi-layer structure. The multi-layer structure may be achieved by self-assembly or layer-by-layer deposition.

In some embodiments, the structure further comprises rare-earth doped nanocrystals.

BRIEF DESCRIPTION OF THE DRAWINGS

The patent or application file contains at least one drawing executed in color. Copies of this patent or patent application publication with color drawings will be provided by the Office upon request and payment of the necessary fee.

In order to better understand the subject matter that is disclosed herein and to exemplify how it may be carried out in practice, embodiments will now be described, by way of non-limiting example only, with reference to the accompanying drawings, in which:

FIG. 3a is an emission spectrum of upconverted luminescence excited at 680 nm (B-blue) which closely resembles the ensemble emission spectrum excited at 405 nm (R-red); FIG. 3b is an excitation energy density dependence of the upconverted luminescence (circles) along with a quadratic (R-red) and linear (G-green) which fits to the respective parts of the curve; FIG. 3c represents the saturation of the red emission with increasing excitation pulse energy;

FIG. 4a is a 570 nm emission transient induced by a weak 680 nm pump (continuous line) and followed by a strong 1064 nm probe pulse (dashed line); FIG. 4b is a red emission transient with (dashed line) and without (continuous line) delayed 1064 nm pulse; FIG. 4c shows the dependence of the upconverted luminescence intensity on the probe pulse energy; FIG. 4d shows the upconversion luminescence intensity at a fixed pulse energy, as a function of the wavelength of the visible pump (circles), compared with the ensemble absorption cross section (line);

FIG. 5a is a single dot spectrum collected over 30 sec upon excitation with a 470 nm pulsed diode laser; FIG. 5b shows an excitation power dependence of single dot upconverted luminescence; the emission intensity is shown in curve B on the top plot and the excitation power is shown in curve G in the bottom plot; FIG. 5c shows binned and averaged upconverted emission intensity of a single NC as a function of excitation power (blue dots) along with a quadratic fit;

FIG. 7a shows a schematic illustration of a QD structure according some embodiments of the present invention. Shown at the bottom is a schematic energy diagram of the QD aligned with the structure on top; FIG. 7b shows absorption and emission spectra from 5 stages of the synthesis (cores only, growth of CdS barrier and three stages of CdZnSe growth); FIG. 7c are TEM images of QDs from the 5 stages introduced in FIG. 7b; and;

DETAILED DESCRIPTION OF EMBODIMENTS

Figure 1:
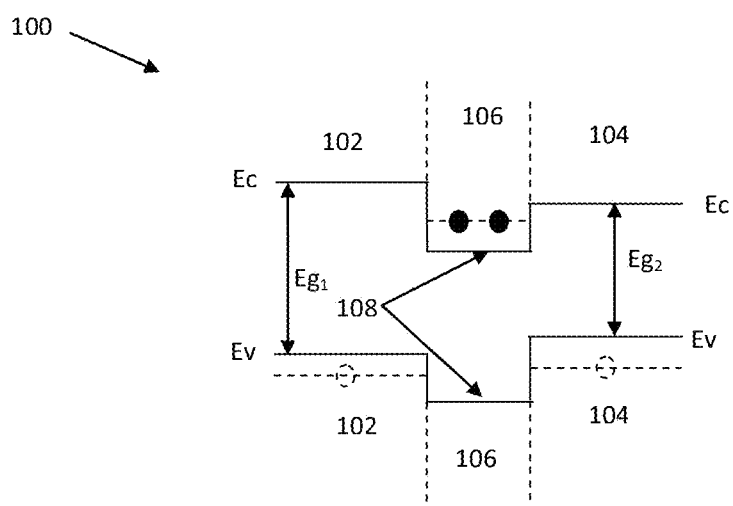
FIG. 1 represents a band diagram for the structure of the present invention.

Reference is made to FIG. 1 representing a band diagram for the structure of the present invention in which one type of charge carriers (e.g. holes) is spatially localized in a single region whereas oppositely charged carriers are separated by a thick tunneling barrier (ranging from a few nanometers to several tens of nanometers). The colloidal semiconducting structure 100 comprises two quantum dots 102 and 104 of different bandgap physically coupled to one another and spaced apart via a barrier material 106. The first and second quantum dots 102 and 104 may be made of the same material with different crystal structure or strain. The first quantum dot 102 is selected to be light emitting while the second quantum dot 104 is capable of responding to photoexcitation by creation of excited charge carriers. In some embodiments, the first quantum dot 102 is selected to have a higher energy band gap $Eg_1$ than the energy band gap $Eg_2$ of the second quantum dot 104. The materials of the quantum dots and of the barrier are selected such that at least a double potential well 108 (or higher, e.g. triple) is formed splitting carriers into two spatially distinct regions, while the oppositely charged carrier is localized in a single region or further delocalized throughout the entire structure. Upon photoexcitation of both quantum dots 102 and 104, the quantum dots 102 and 104 are capable to emit in either one of two distinct spectra. The structure 100 provides an upconversion system by exploiting either Auger recombination or intraband absorption as a coupling mechanism. By tailoring its composition and morphology, a semiconducting nanostructure is provided where excited electrons are delocalized over the entire structure, but a double potential well is formed for holes. Upconversion is expected to occur by the sequential absorption of two photons. The first photon excites an electron-hole pair via intraband absorption in the lower bandgap dot, leaving a confined hole and a relatively delocalized electron. The second absorbed photon can lead, either directly or indirectly, to further excitation of the hole, enabling it to then cross the barrier layer. This, in turn, is followed by radiative recombination with the delocalized electron. In some embodiments, the present invention provides a new structure for luminescence upconversion in semiconductor nanocrystals (NCs), enabling the manufacture of complex multicomponent systems. In some embodiments, the structure comprises a compound semiconductor NC. In some embodiments, the structure is capable of emitting in two distinct spectra.

In some embodiments, at least one of the first and second quantum dots comprises a single nanoparticle in the sense that crystalline order may be maintained throughout the entire structure. For example, epitaxially grown seeded semiconductor nanorods as described for example with respect to FIG. 2b can be used.

Figures 2A, 2B, 2C, 2D, 2E:
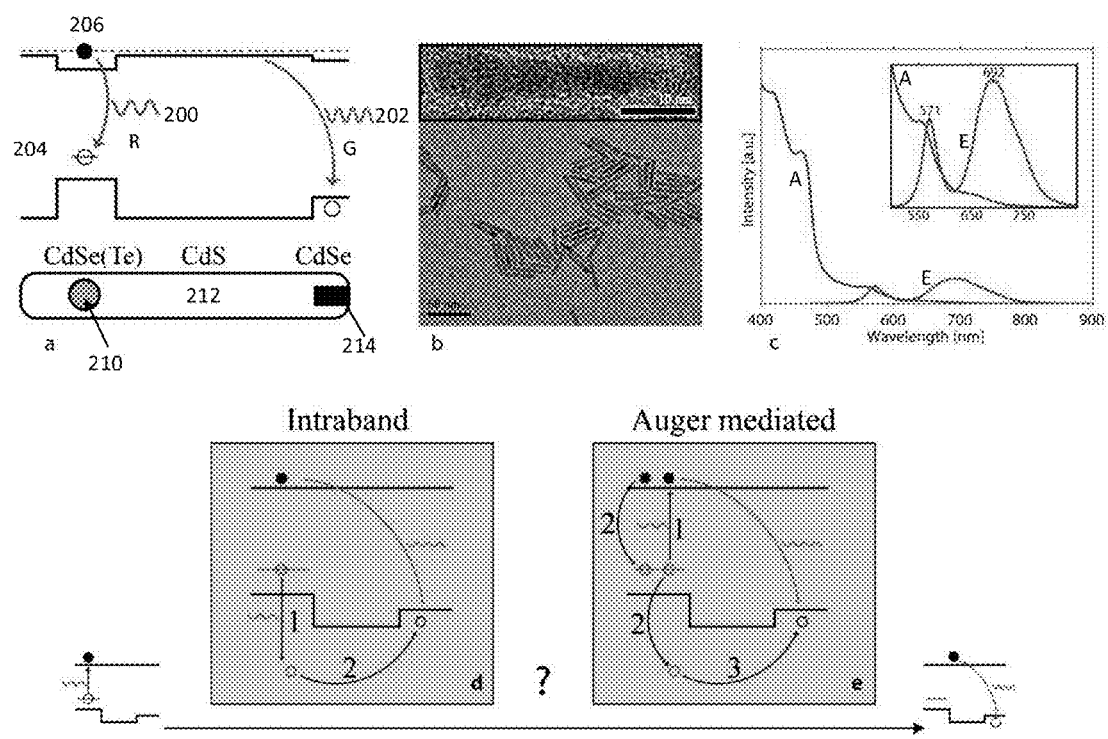
FIG. 2a schematically depicts a dual emitting quantum dot according to some embodiments of the present invention.
FIG. 2b is a TEM image of the nanocrystals, where a magnified view of a single nanocrystal is presented at the top of the image.
FIG. 2c is absorption and emission spectra; the inset shows a magnified view of the spectral region around the two emissions.
FIG. 2d is a direct intraband hole absorption mechanism of upconversion.
FIG. 2e is an Auger mediated upconversion.

Reference is made to FIGS. 2a-2e representing possible upconversion processes in NC. Upconversion is expected to occur by the sequential absorption of two photons. In broad terms, the first photon 200 excites an electron-hole pair via intraband absorption in the lower bandgap dot, leaving a confined hole 204 and a relatively delocalized electron 206. The second absorbed photon 202 can lead, either directly or indirectly, to further excitation of the hole 204, enabling it to then cross the barrier layer. This, in turn, is followed by radiative recombination with the delocalized electron. FIG. 2a is a schematic depiction of dual emitting quantum dot (QD) structure being capable of operating as a two-color quantum emitter in which the inventors have modified a previously reported synthetic procedure [12] to dramatically enhance emission quantum yields, reproducibility and particle uniformity. In the structure of FIG. 2a, according to some embodiments of the present invention, a first quantum dot 210 (e.g. CdSe(Te)) is embedded in the barrier material 212 (e.g. CdS) and a second quantum dot 214 (e.g. CdSe) is located at the tip of the barrier 212. In this example, the barrier 212 has a rod-like shape. The low energy transition (R arrow) results from the hole localized in the doped core 210 and the high energy transition (G arrow) results from the second CdSe dot 214 at the tip of the CdS barrier 212. In the non-limiting example of FIG. 2a, Te-doped CdSe nanocrystals with a 4 nm diameter [15] were used as seeds for over-growth of about 40 nm CdS nanorods [16]. The rod configuration enables to easily control the distance between the two active dots, as well as to ensure that FRET between them is mitigated. It should be understood that FRET mechanism leads to loss of higher energy photons and therefore for upconversion FRET should be reduced. If the rod is long enough, FRET becomes negligible. At the tip of the nanorod, small amounts of Cd and Se were deposited to form a second CdSe dot 214, leading to emergence of a second emission color from the nanocrystals as seen in FIG. 2c. The centroids of the two emissions in the final product are at 570 and 690 nm. The higher energy emission color can be controlled by tuning the size of the second CdSe dot 214. A TEM image of the nanocrystals is shown in FIG. 2b. A magnified view of a single nanocrystal is presented at the top of the image. Exciting at 400 nm, the quantum yield (QY) of both emissions combined was measured to be about 42% (having a ratio of about 10:1 in favor of the lower energy emission). The synthesis and nanocrystal characterization will be detailed further below.

FIG. 2c represents absorption (A) and emission (E) spectra. The CdS absorption is visible around 460 nm. The inset shows a magnified view of the spectral region around the two emissions. The two possible mechanisms by which upconversion could transpire are schematically outlined in FIGS. 2d-2e. FIG. 2d is a direct intraband absorption of the second photon by the hole. FIG. 2e is an Auger mediated transition, whereby two excitons are initially formed in the core and a non-radiative Auger recombination of one electron-hole pair provides energy for ejection of the second hole. The latter mechanism is reminiscent of attempts to achieve upconversion in quantum-well based devices [13, 14]. In these, multiple excitations of a low-bandgap quantum well interact with one another via the Auger mechanism, leading to ejection of carriers from the quantum well to the host, and resulting in higher energy luminescence (the effect is also known as an 'Auger fountain'). In the structure of the present invention, the dominant mechanism is intraband absorption, unlike in the case of quantum wells. Moreover, the structure of the present invention is operational at room temperature whereas quantum well upconversion is often limited to temperatures below that of liquid nitrogen. Such room-temperature control of the emission flux could be used in the framework of Stimulated Emission Depletion (STED) superresolution microscopy technique, where a doughnut shaped NIR beam will inhibit VIS emission at the peripheral regions of the excitation point spread function, practically localizing the excited area beyond the diffraction limit.

Figure 3A:
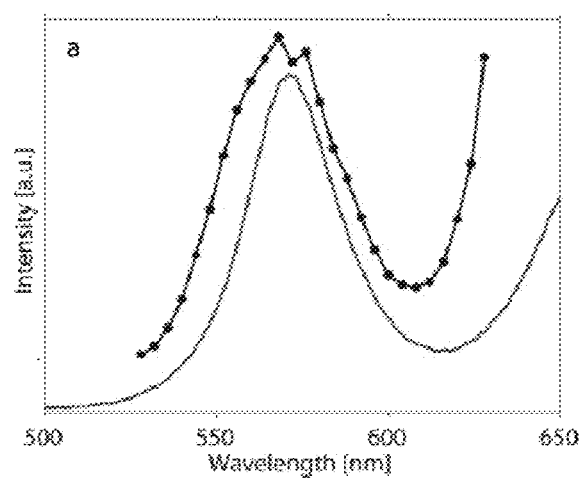
FIGS. 3a-3c are upconversion measurements; in particular
Figure 3B:
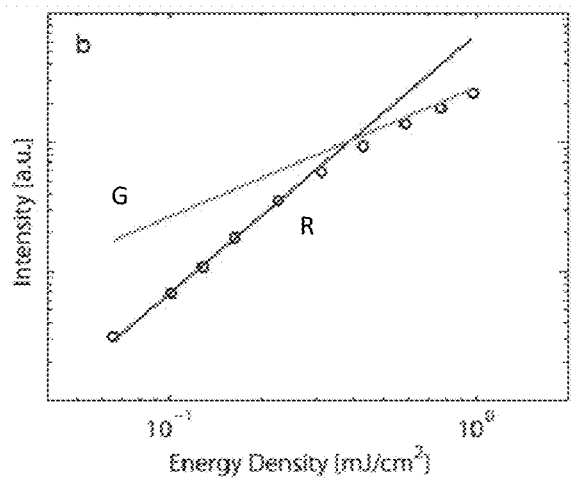
Figure 3C:
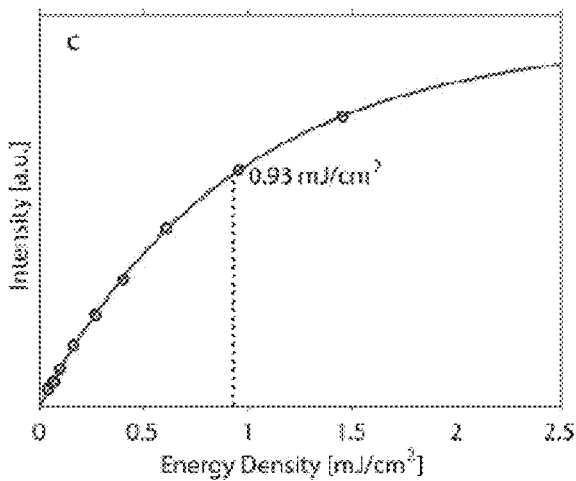

To examine the prospect of upconversion in the structure of the present invention, a dilute solution of the NCs in toluene was first illuminated with 5 ns 680 nm pulses and the emission was measured around 570 nm. The pulse duration is much shorter than the radiative lifetime of the lower energy emission (about 100 ns). Thus, multiple excitations can occur within the same pulse, leading to upconversion. FIG. 3a shows that the emission spectrum of upconverted luminescence excited at 680 nm (curved line) closely resembles the ensemble emission spectrum excited at 405 nm (curved line with circled points) Indeed, the emission spectrum of the upconverted luminescence, plotted in FIG. 3a, closely follows the ensemble emission (the sharp rise at about 630 nm is due to directly excited emission from the core). As upconversion requires the successive absorption of two red photons, a quadratic dependence of the upconverted intensity with excitation pulse-energy is expected at low excitation intensities. Upon saturation (e.g. when the probability of absorption of at least one photon per particle within the pulse approaches unity), the dependence should turn linear. FIG. 3b represents an excitation energy density dependence of the upconverted luminescence (circles) along with a quadratic (R curve) and linear (G curve) which fits to the respective parts of the curve. FIG. 3c shows saturation of the red emission with increasing excitation pulse energy. As can be seen in FIG. 3b, this trend is indeed observed, with the roll-off occurring at an excitation density of about 0.4 mJ/cm$^2$. This value is somewhat lower than the saturation excitation density of the 680 nm emission, which is about 0.93 mJ/cm$^2$, as shown in FIG. 3c. This indicates that upconversion in the structure of the present invention is dominated by the intraband absorption mechanism depicted in FIG. 2d, rather than the Auger mediated mechanism depicted in FIG. 2e. In the latter mechanism the roll-off would be expected to occur at a higher excitation density than the linear emission saturation of the 'red' dot (0.93 mJ/cm$^2$) due to the lower probability of a second intraband excitation [15].

Figures 4A, 4B, 4C, 4D:
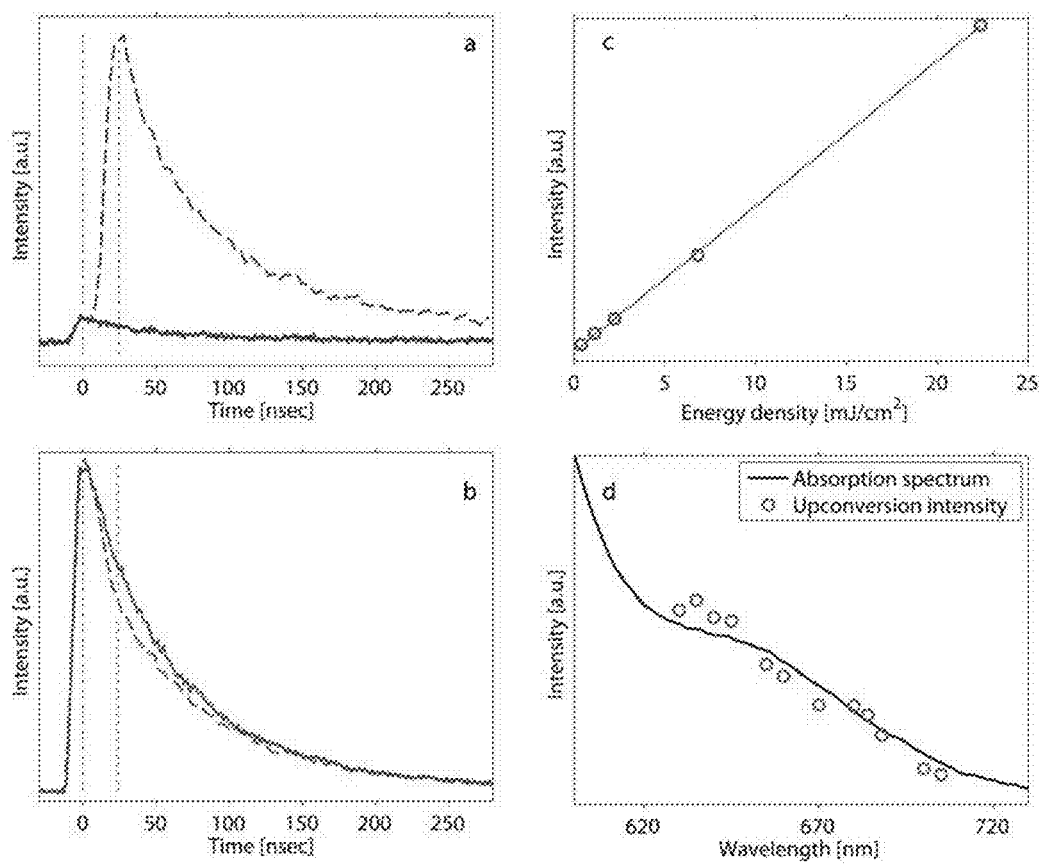
FIGS. 4a-4d are pump-probe luminescence upconversion experiments; in particular

To substantiate that intraband absorption is playing a significant role, a pump-probe experiment was performed, where the 5 ns 680 nm pump pulse is followed, 22 ns later, by a 5 ns near-infrared pulse at 1064 nm, which cannot induce intraband absorption in this system. FIG. 4a presents a 570 nm emission transient induced by a weak 680 nm pump (continuous line) and followed by a strong 1064 nm probe pulse (dashed line). As seen in FIG. 4a, a weak upconversion signal due to the relatively weak 680 nm pump pulse, is followed by a steep rise upon the arrival of the delayed 1064 nm probe pulse. This clearly shows that intraband hole absorption is in play. FIG. 4b presents a red emission transient with (dashed line) and without (continuous line) delayed 1064 nm pulse. Remarkably, as seen in FIG. 4b, a drop in the intensity of the red emission transient is revealed due to partial depletion by the probe pulse. FIG. 4c shows the dependence of the upconverted luminescence intensity on the probe pulse energy. As seen in FIG. 4c, the increase in upconverted emission intensity is linear in the probe pulse energy density, as expected. FIG. 4d shows upconversion luminescence intensity at a fixed 1064 nm pulse energy, as a function of the wavelength of the visible pump (circles), compared with the ensemble absorption cross section (line). Moreover, fixing the probe energy, while scanning the wavelength of the pump, the upconversion intensity is simply proportional to the ensemble absorption cross section (as seen in FIG. 4d), further evidence of a simple, two-step upconversion process.

Once a hot hole is excited in the core, the overall efficiency of the upconversion process is determined by the multiplication of two probabilities—the probability of a hot hole crossing the barrier and the radiative QY of the 570 nm emission. To estimate the former, the saturation intensity of the 570 nm luminescence was measured upon saturated excitation at 500 nm, which serves as a reference to the QD concentration. Using the same setup and upon excitation at 680 nm with 0.93 mJ/cm$^2$ per pulse, the upconverted emission was measured to be 570 times weaker. Considering the statistics of photon absorption, the number of hot holes formed can be estimated. The probability of a hot hole crossing the barrier is calculated to be about 1%. The 570 nm emission QY can be estimated from ensemble absolute QY data to be at least 10%. Overall, the estimated maximum upconversion efficiency under saturated excitation (often termed elsewhere as the 'upconversion quantum yield') is about 0.1%. Since the energy density of about 1 mJ/cm$^2$ needs to be delivered within the lifetime of the core exciton, which is about 100 ns (and is much longer than the 5 ns pulses used here), the excitation power density required for achieving this efficiency is approximately 10$^4$ W/cm$^2$.

Figure 5A:
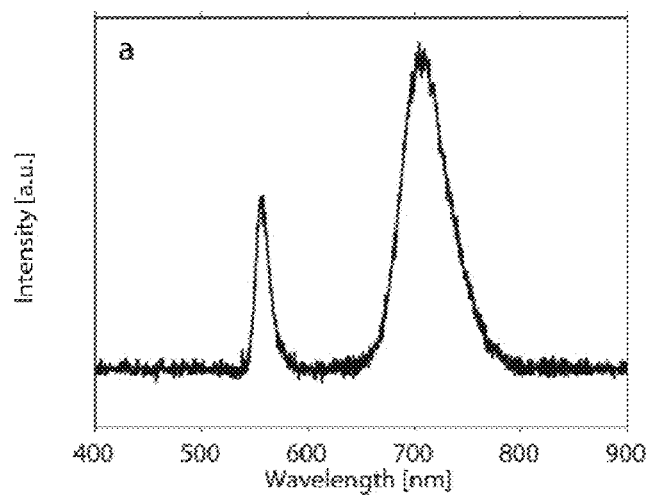
FIGS. 5a-5c are single NC upconversion measurements; in particular
Figure 5B:
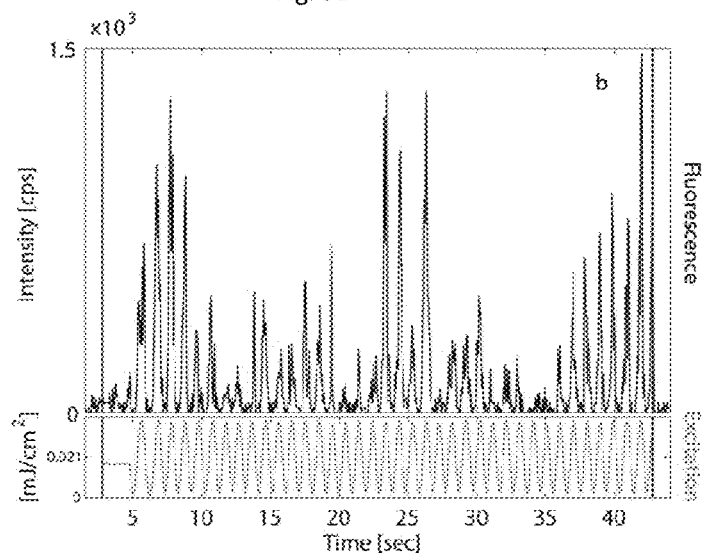
Figure 5C:
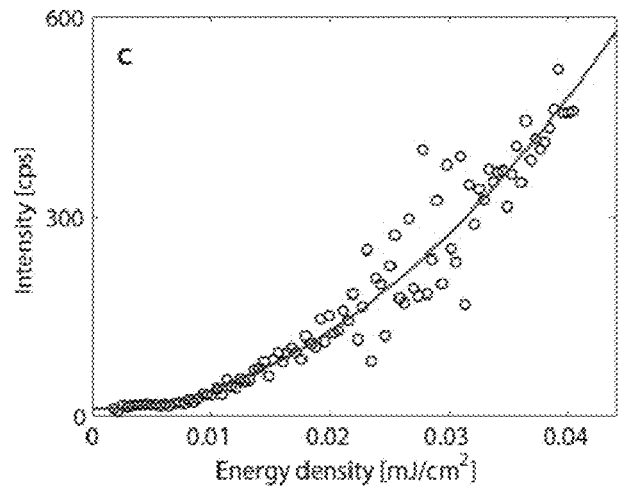

Finally, single particle upconversion experiments were performed. To confirm 2-color fluorescence, single QD spectra were collected upon excitation over 30 sec with a 470 nm diode laser as shown in FIG. 5a. For upconversion measurements, dots were excited by 690 nm light from a femtosecond oscillator, and the upconverted luminescence was measured by time-correlated single photon counting. The excitation intensity was modulated to record the power dependence of upconverted fluorescence as portrayed in FIG. 5b. FIG. 5b shows an excitation power dependence of single dot upconverted luminescence. The emission intensity is shown on the top plot and the excitation power is shown in the bottom plot. The fluorescence intermittency typically observed for single QDs is clearly seen. Due to the relatively low count rate, it is difficult to determine whether the distribution of emission intensities is due to a continuous distribution of emission intensities or due to the relatively long time bins utilized. FIG. 5c shows binned and averaged upconverted emission intensity of a single nanocrystal as a function of excitation power (dots) along with a quadratic fit. The distinct quadratic dependence of the emission intensity as a function of the excitation intensity is shown and was observed for about 30 sampled particles. Typical particles exhibited upconverted luminescence of up to thousands of counts per second.

The structure of the present invention may be based on semiconductor components in the strongly confined regime and therefore provides broad tunability of both the absorption edge and the luminescence color via size tuning. This is in Stark contrast with rare-earth doped nanocrystals, whose absorption spectra cannot be easily tuned, and where the use of 'antennas' is required for broadening the frequency response [8]. The observed 0.1% upconversion efficiency is comparable to that obtained from rare-earth doped nanocrystals, where typical efficiencies are about 0.3% [17], and reported record efficiencies are of about 1% (for particular excitation wavelengths, either 980 nm [7] or 1490 nm [18]). The required excitation power density at saturation in the structure of the present invention was 10$^4$ W/cm$^2$, which is 2 orders of magnitude higher than that observed in rare-earth doped nanocrystals [8,9,28,29] but many orders magnitude lower than those required for upconversion via two-photon absorption (which are of the order of 1 GW/cm$^2$ [19 and references therein]).

In some embodiments, the structure of the present invention comprises a solid-state fluorophore emitting in two distinct spectral bands and exhibiting antibunching between them. The structure is made by using advanced colloidal synthesis methods in conjunction with band-gap engineering. The fluorophore is based on a composite semiconductor nanocrystal incorporating two separately emitting components that are coupled via Coulomb-mediated exciton-exciton interactions. A two-color emitting fluorophore requires the combination of two subsystems emitting at different colors.

In this connection, it should be noted that in [20,21] systems were realized with colloidal quantum dots by first depositing a thick shell of a wide band-gap material on a spherical quantum dot to form a typical core-shell structure, and then growing an outer layer of a lower band gap material to form an independently emitting quantum well. In this type of structure both electron and hole should be transferred across the energy barrier in order to achieve upconversion, a highly unlikely process. However, to achieve photon correlations between the two emitters a coupling mechanism is required. It must strongly affect the emission properties (e.g. emission color, lifetime or quantum yield) of at least one of the two emitters upon photoexcitation of both. When more than two charge carriers are present in a strongly confined QD, carrier relaxation is dominated by a nonradiative decay channel. Energy from recombination of an exciton is transferred to a spectator charge rather than being released as a photon. Upon recombination of an exciton the released energy leads to further excitation of a spectator charge carrier, which then rapidly cools to the band edge via phonon states. Auger recombination is responsible for the extremely reduced emission quantum yields observed from multiple excited states of colloidal QDs.

Figure 6:
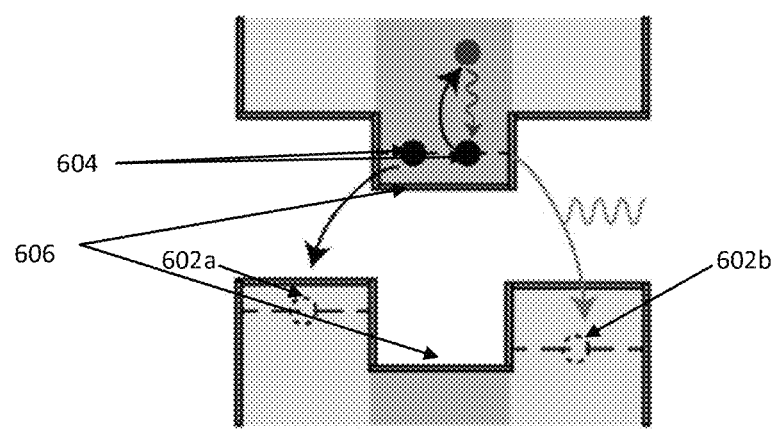
FIG. 6 represents a band diagram for a dual-color emitting fluorophore of the present invention in which the electrons are spatially localized in a single region whereas holes are separated by a thick tunneling barrier.

Reference is made to FIG. 6 schematically representing a two-color emitting system, which exploits Auger recombination as the coupling mechanism. Here, one type of charge carriers 602a-602b (e.g. holes) is confined by a double-well potential 606, essentially splitting carriers into two spatially distinct regions, while the oppositely charged carrier 604 is localized in a single region. In this system trion Auger recombination can efficiently occur between two electrons and one of the holes, strongly suppressing simultaneous dual-color emission. This is schematically shown for the case in which the hole on the left 602a recombines non-radiatively leaving an electron and the hole on the right free 602b to recombine radiatively. While this system is capable of emitting in two colors, due to the nondegenerate valence band positions of the two regions, simultaneous two-color emission is expected to be significantly inhibited. When both emitters are simultaneously excited, each of them is essentially occupied by a trion, which undergoes rapid Auger decay, as depicted in FIG. 6. Thus, no more than a single photon is emitted despite the double excitation of the QD. The probability to emit either a 'green' or a 'red' photon is determined, in this case, by the ratio of nonradiative recombination rates of the two trion systems and by the rate of FRET from the higher energy well to the lower energy one.

The inventors have experimentally realized the system schematically depicted in FIG. 6 using exclusively II-VI semiconductors, for which synthetic protocols are highly evolved.

Figures 7A, 7B, 7C:
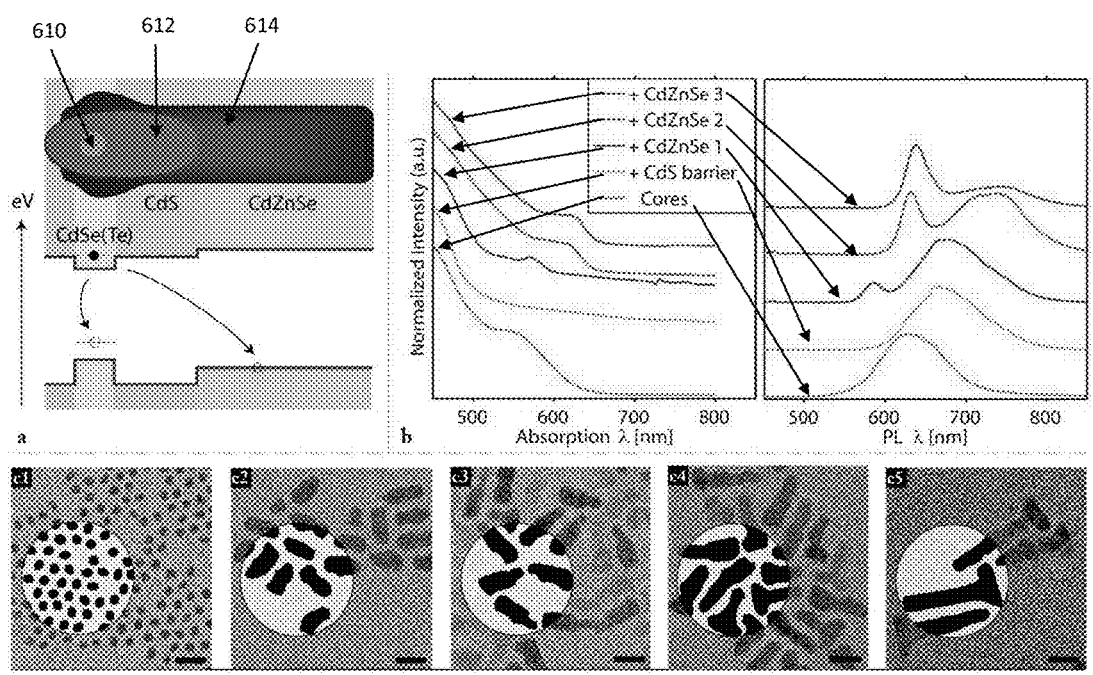
FIGS. 7a-7c show a possible synthesis of dual emitting quantum dots; in particular.

Reference is made to FIGS. 7a-7c showing the synthesis of dual emitting quantum dots according to the teachings of the present invention. FIG. 7a is a schematic illustration of the QD structure, according to one embodiment of the present invention. The CdSe(Te) core is portrayed in 610, the CdS barrier in 612 and CdZnSe is 614. Shown at the bottom is a schematic energy diagram of the QD aligned with the structure on top. The barrier layer was selected to be made of CdS (predominantly) and the hole localizing regions were selected to be CdSe and CdZnSe. To generate a significant spectral shift between the two emission bands, the CdSe core is isovalently doped by Tellurium, leading to substantially red-shifted emission. This choice also significantly mitigates FRET between the two emission centers, as the absorption edge is hardly affected by doping. FIG. 7b shows absorption and emission spectra from 5 stages of the synthesis (cores only, growth of CdS barrier and three stages of CdZnSe growth). Consecutive spectra are vertically shifted for clarity. FIG. 7c shows TEM images of QDs from the 5 stages introduced in FIG. 7b. The scale bars are 10 nm. A graphical mask of the particles in each image is overlaid with a small region of the original TEM image to guide the eye. CdZnSe can be seen to grow initially as a thin extension protruding from the rodlike particles of stage 2. Further growth leads mostly to the lengthening and thickening of this protrusion. Additional lobes form on the opposite end of the rods at later stages of the synthesis.

The theoretical system presented schematically in FIG. 6 differs slightly from the system of FIG. 7a in that in the former, electrons are localized exclusively within the barrier shell, whereas in the latter the electrons inhabit both the core and the barrier. This, however, is inconsequential for the trion-based coupling mechanism described above.

The following describes a specific and non-limiting synthetic procedure: Spherical Te-doped CdSe QDs, having a 3 nm diameter and emitting at 620 nm (see TEM image in FIG. 7c1), are used as seeds for overgrowth of a thick CdS layer, which transforms them into ellipsoidal particles with axes of 7.5 and 3.5 nm (not shown). This selection of core size in a CdSe/CdS seeded rod leads to significant delocalization of the electron into CdS—a prerequisite for producing overlap between electrons in the core and holes in an external shell beyond the barrier (as portrayed schematically in FIG. 6). Electron delocalization is indeed confirmed by observation of a 60 nm redshift in the emission throughout the course of the CdS growth stage. These NCs were grown further by deposition of additional CdS on top of the existing seeded-grown CdS layer, resulting in chunky rod-shaped particles (FIG. 7c2). Upon growth of CdZnSe alloy as an external layer, significant emission is expected to emanate from the CdS/CdZnSe interface. Indeed, a second emission peak appears at 580 nm as seen in the emission spectrum depicted in FIG. 7b. CdZnSe growth is initially seen as a thin extension protruding from the seeded rods (FIG. 7c3). Further growth leads mostly to the lengthening and thickening of this protrusion (FIG. 7c4) and, at later stages, to formation of additional lobes on the opposite end of the rods (FIG. 7c5). Throughout CdZnSe growth, the two emission colors remain completely distinguishable, providing easy access to optical studies on two color emission. The higher energy emission peak becomes more dominant as growth progresses, due to the increased probability of absorption in the CdZnSe layer. The overall quantum yield (QY) of the QDs was estimated to be about 5% by comparing to fluorescence of a dye standard. Measurements were performed using an excitation of 532 nm and the branching ratio between NIR and VIS emissions was found to be 4:1.

The following describes in detail a specific and non-limiting nanoparticle synthesis: Te doped CdSe core nanocrystals were prepared using a procedure described in detail further below. For further seeded growth of CdS, a method described in detail further below was used. The core-rod NCs were separated for further growth of the CdSe dot at the tip end by multiple purification steps in known solvent anti-solvent combinations such as chloroform/methanol and toluene/acetone. They were then redissolved in a mixture of trioctyl phosphine (TOP), trioctyl phosphine oxide and oleylamine and the solution was heated to 200° C. Following this, small amounts of a selenium solution in TOP and of Cadmium acetate in TOP were added until a second emission peak emerged at 540-550 nm. Further additions of Sulfur solution in TOP and Cadmium acetate in TOP over the course of 90 minutes led to the desired emission at 570 nm.

In this specific and non-limiting example the chemicals and materials which have been used for synthesizing the nanoparticle are as follows: Cadmium oxide (CdO, 99.99%), cadmium acetate (CdAc, 99%), oleic acid (90%), tri-n-octylphosphine (TOP, 90%), trioctylphosphine oxide (TOPO, 99%), octylamine (97%), octadecene (ODE, 90%), selenium (Se, 99.999%), tellurium (Te, 99%) and Sulfur (S, 99.5%), organic solvents, Tetradecylphosphonic acid (TDPA), hexylphosphonic acid (HPA), octadecylphosphonic (ODPA), Oleylamine (OA, 80-90%).

The core nanocrystals were prepared as follows: Se:TOP and Te:TOP 0.1M solutions were prepared by dissolving 0.2 mmol of each in 2 ml TOP in vials placed in a sonicator under heat. A Se/Te precursor was prepared by mixing 40 µl of Te:TOP with 1 ml Se:TOP (Te constitutes 4% of the Cd in reaction). A 50 ml round bottom flask was charged with 19 mg (0.15 mmol) CdO, 90 mg TDPA and 6 ml ODE. After degassing under vacuum for 30 min at 100° C., temperature was raised to 305° C. under argon. Immediately upon dissolution of CdO the Se/Te precursor was injected. The solution color changed within 10-20 seconds to a deep dark red shade after which heating mantle was removed. 5 ml nonanoic acid was added upon cooling to 100° C.

The seeded growth of CdS was prepared as follows: the CdSe(Te) quantum dots (QDs) were purified for reaction by dilution in toluene and precipitation with acetone then re-dissolution in 1 ml chloroform/oleic acid/TOP (1:1:8). The solution containing about 26 nano-mole QDs, was then mixed with a 2 ml S:TOP solution containing 120 mg S. A 50 ml round bottom flask was charged with 86 mg (0.67 mmol) CdO, 312 mg ODPA, 82 mg HPA and 3.14 g TOPO. The reaction flask was degassed for 1 hour at 150° C. and then temperature was raised to 350° C. Upon dissolution of CdO at 300° C., 2 ml TOP were added and temperature was allowed to continue climbing. The QD/S solution was quickly injected into the flask as soon as temperature reached 350° C. Reaction was stopped after 6 min by removal of heat and at 150° C., 2 ml nonanoic acid were added. A relatively sharp CdS absorption feature at 450 nm can be recognized in the absorption spectrum.

The growth of CdSe dot at tip of CdS rod was prepared as follows: The core-rod NCs were separated for reaction by multiple purification steps in known solvent anti-solvent combinations such as chloroform/methanol and toluene/acetone and finally redissolved in 1 ml TOP. CdAc in TOP 0.04M was prepared by dissolving 24 mg CdAc in 2.25 ml TOP and Se:TOP 0.04M was prepared by appropriately diluting the previously prepared 0.1M solution. S in ODE 0.04M was prepared in a separate flask by heating S and ODE to 200° C. until the solution is clear and slightly yellow. A 50 ml round bottom flask was charged with 1.8 g TOPO, 2 ml oleylamine and 2 ml ODE and degassed under vacuum for 2 hours. NCs in TOP were added to reaction flask at 80° C. and temperature was raised to 200° C. 0.6 ml Se:TOP was then added dropwise at 0.1 ml portions every 10 min. Next 0.3 ml CdAc:TOP was added dropwise also at 0.1 ml portions every 10 min. At this point a second peak begins to emerge around 540-550 nm. The reaction was allowed to sit for another 90 min over the course of which intermittent additions of 0.1 ml S:ODE and CdAc:TOP continue strengthening and spectrally redshifting the second peak. An excess of S over Cd is kept throughout the additions.

To monitor nanocrystal growth during the synthesis, aliquots of reaction solution were extracted regularly and dispersed in toluene. Photoluminescence was excited by a 405 nm continuous wave laser (crystalaser), and spectra were measured with a UV-VIS spectrofluorimeter. UV-VIS absorption spectra were measured with a UV-VIS/near-IR spectrophotometer. TEM images were taken at 120 kV. The samples were prepared by drop casting dilute solutions of the various QDs onto 400-mesh copper grids coated with a formvar-carbon film and excess liquid was wicked with filter paper.

The following describes in detail specific and non-limiting optical measurements: samples consisted of a dilute solution of NCs in toluene, placed in a 1 cm×1 cm glass cuvette. Excitation light from a nanosecond optical parametric oscillator (Ekspla NT-UV342) was directed towards the cuvette, and fluorescence was collected at the orthogonal direction, spectrally filtered and directed towards a monochromator (Acton SP2150) and measured by a photomultiplier (Hamamatsu R11540). The photomultiplier transient output was measured by a digital oscilloscope (LeCroy Wavesurfer 62Xs). For pump-probe measurements, the residual 1064 nm pump laser was passed through an optical delay line and recombined with the excitation beam using a dichroic mirror.

The following describes in detail specific and non-limiting sample preparation for single QD spectroscopy: A 2% w/v solution of polymethylmethacrylate (PMMA) in toluene was prepared for incorporation of the NCs in a thin film. A mild extraction of the NCs from the mother solution was carried out by dissolving a small amount in hexane/octadecene and adding acetone/methanol for phase separation. The NC phase was then diluted in hexane, filtered and then diluted again 10 fold in toluene to give an almost colorless solution. 100 µl of this solution was diluted in 1 ml PMMA/toluene. This solution was then spin cast onto glass slides using a speed of 8,000 RPM. The resulting intra QD spacing was about 15 micron.

The following describes in detail specific and non-limiting single nanoparticle imaging and spectroscopy: single dot optical measurements were performed using a custom-built optical characterization system based on a commercial inverted microscope (Zeiss Axiovert 200). Imaging of the film was achieved by the use of 475 nm LED wide-field illumination in a transmission setup. Photoluminescence was imaged through an oil immersed objective (Zeiss Plan Apochromat X63 NA 1.4) and two spectrally exclusive band pass filters for recognizing the two emission colors (540-580 nm and 690-740 nm) onto an electron-multiplying CCD camera (Acton-PI PhotonMax 512). For illumination of a single NC a 690 nm Ti: Sapphire laser was used, emitting 100 fsec pulses at a repetition rate of 80 MHz. The signal was epi-collected, coupled to a single mode fiber and measured by an avalanche photodiode (Laser Components count blue or Perkin Elmer SPDC). The avalanche photodiode signal was evaluated by a time-correlated single photon counting device (Picoquant Hydraharp 400) triggered by the excitation laser. For measurement of upconversion signal a 590 nm short pass dichroic mirror was used.

The power of the incoming beam was modulated by passing it through a rotating waveplate and a polarizer. Part of the beam was diverted to a photodiode for power measurement (Ophir PD300-UV and Juno power meter) allowing continuous monitoring of the power throughout the measurement.

Excitation of individual NCs for spectroscopic measurements was done with a tightly focused beam of a 473 nm pulsed diode laser emitting 70 ps pulses at a 5 MHz repetition rate (EPL 470). The energy flux was approximately 2.4 µJ/cm$^2$ per pulse. Emitted photons were imaged onto a fiber-bundle coupling the light to a spectrometer (Acton-PI SP2300), equipped with a 4-stage thermoelectrically cooled CCD camera (Acton-PI Pixis 256).

Figure 8A:
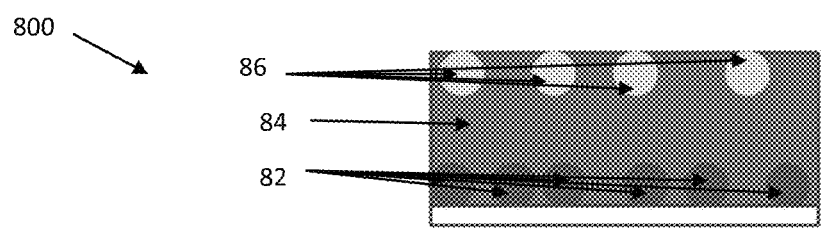
FIGS. 8a-8b show a schematic layout of a layered colloidal upconversion structure (8a) and a colloidal quantum dot solid upconverter (8b).
Figure 8B:
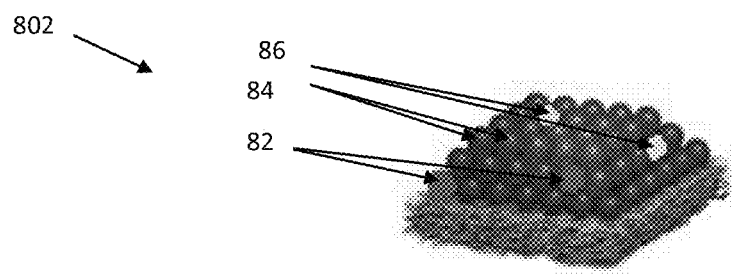

FIGS. 8a-8b present another embodiment of the present invention in which two new types of colloidal quantum dot solids for luminescence upconversion are experimentally studied. The colloidal semiconducting structures 800 and 802 comprise two quantum dots (donor dots 82 and acceptor dots 86) of different bandgap physically coupled to one another and spaced apart via a barrier layer 84.

FIG. 8a shows a multi-layer (layered) colloidal upconversion structure 800, where a layer of donor dots 82 is deposited on a substrate, the barrier layer 84 is grown on top of it by chemical bath deposition, and the second layer of acceptor dots 86 is deposited on top of the barrier layer 84. In a specific and non-limiting example, the multi-layer structure is achieved as follows: donor nanocrystals are deposited on a glass surface from a solution using mercaptosilane linkers. Following this, Successive Ion Layering and Adsorption (SILAR) is used to grow a CdS layer of controlled thickness from aqueous solutions. Finally, emitter QDs are deposited from a solution using short dithiol linkers (such as benzenedithiol). A thin additional layer of CdS or CdZnS can be deposited for enhanced surface passivation. If near-infrared donors such as PbS are used, it may be desirable to replace the barrier layer with CdSeS.

FIG. 8b shows a three-dimensional quantum dot solid colloidal crystal structure 802, deposited entirely from a solution, and containing donor 82, barrier 84 and acceptor quantum dots 86 grown at similar sizes. These are known to form close-packed crystals (as shown in FIG. 8a) which can be post-treated to enhance carrier conductivity with the quantum dot solid. By controlling materials and relative concentrations, efficient devices can be achieved, as well as devices capable of converting three quanta of radiation into a single higher energy quantum (of course, at a lower yield). In this embodiment, the nanocrystals take on the role of individual ions, and charge transfer (either in the valence band or in the conduction band, depending on the particular choice of materials) fulfills the role of coupling. This configuration reduces the material compatibility requirements within the nanocrystal. In a specific and non-limiting example, the colloidal crystal solid structure is achieved as follows: a mixture of similarly sized (5-6 nm diameter) ZnTe/CdS absorbers, CdS dots and CdSe/CdS emitters, is first deposited on a cleaned surface. A post-treatment with a hydrazine/chalcogenide linker can follow, or the structure may be directly spin coated after ligand exchange with the hydrazine/chalcogenide mixture. The relative concentrations of the three components provide degrees of freedom. Rare-earth doped nanocrystals (e.g. based on a $NaYF_4$ host) can also be combined in the structure in a similar manner, though a colloidal deposition process. In a specific and non-limiting example, the rare-earth doped particles can be added in conjunction with the rest of the dots in the quantum dot solid configuration, or as an additional layer in the vicinity of the 'donor' layer in the layered configuration. These could act as sensitizers for the first upconversion step and transfer their energy via FRET to neighboring quantum dots. Low-bandgap dots (such as InSb or PbS) can also be used in these structures so as to extend the spectral range currently available for upconversion beyond the absorption spectrum of Erbium. In a specific and non-limiting example, similarly to the examples described in FIG. 2a the following materials can be used: CdS as a barrier layer, CdSe/CdS as a first quantum dot (e.g. emitter) and CdSe:Te, CdTe or ZnTe/CdS as a second quantum dot (e.g. sensitizers).

In some embodiments, some of the II-VI may be replaced with near-infrared absorbing IV-VI materials such as lead chalcogenides, or even with indirect gap ones, including Si quantum dots. The use of indirect gap materials enables achieving low saturation intensities due to the relatively long lifetime of the intermediate excited state.

The invention claimed is:

1. A colloidal semiconducting structure comprising: two quantum dots of different bandgap physically coupled to one another and spaced apart via a tunneling barrier material, the first of said quantum dots being light emitting while the second of said quantum dots being capable of responding to photoexcitation by creation of excited charge carriers, the materials of the quantum dots and of the barrier are selected to form a double well structure to electrically separate carriers into two spatially distinct regions, while an oppositely charged carrier is spatially localized in a single region or further delocalized throughout an entire structure, such that said quantum dots are capable upon photoexcitation of both quantum dots to emit in at least one of two distinct spectra, wherein said quantum dots and said tunneling barrier material form a potential well in at least one of a conduction band and a valence band, and said colloidal semiconducting structure is configured and operable to exhibit efficient luminescence upconversion followed by radiative recombination.

2. The structure of claim 1, wherein the materials of the first and second quantum dots are selected such that the material of the first quantum dot has a higher energy band gap than the energy band gap of the second quantum dot.

3. The structure of claim 1, wherein at least one of said first and second quantum dots comprises at least one nanoparticle.

4. The structure of claim 1, wherein said first and second quantum dots are made of different materials.

5. The structure of claim 1, wherein said second quantum dot comprises an emitting quantum dot.

6. The structure of claim 1, wherein at least one of said first and second quantum dots is embedded in the barrier material.

7. The structure of claim 6, wherein said second quantum dot is embedded in the barrier material forming a first arrangement being coated by said first quantum dot.

8. The structure of claim 1, wherein said barrier has a rod-like shape.

9. The structure of claim 8, wherein said second particle is located at the tip of the rod-like barrier.

10. The structure of claim 8, wherein said barrier comprises nanorods made of at least one of CdS, ZnSe and CdSeS alloy.

11. The structure of claim 1, wherein at least one of said first and second quantum dots materials comprises semiconducting nanocrystals.

12. The structure of claim 11, wherein at least one of said semiconducting nanocrystals comprises Group II-VI compound semiconductor nanocrystals, Group III-V or IV-VI compound semiconductor nanocrystals.

13. The structure of claim 11, wherein at least one of said first and second quantum dots being made of one or more indirect band gap materials.

14. The structure of claim 11, wherein said second quantum dot comprises at least one of Te-doped CdSe, CdTe, ZnTe, Te-doped ZnSe, PbS, $Ag_2S$, $CuInS_2$, InAs, InSb, PbSe.

15. The structure of claim 10, wherein said first quantum dot comprises at least one of CdZnSe and CdSe, ZnSe.

16. The structure of claim 1, wherein at least one of a size of at least one of said first and second nanoparticles and relative concentration of the materials is selectable to provide tunability of absorption edge and luminescence color.

17. The structure of claim 1, wherein said first and second quantum dots are coupled via Coulomb-mediated exciton-exciton interactions.

18. The structure of claim 1, wherein said first and second quantum dots are coupled via Auger recombination or direct intraband absorption.

19. The structure of claim 1, wherein each of said first and second quantum dots is a single particle.

20. The structure of claim 1, wherein each of said first and second quantum dots forms a layer respectively creating a multi-layer structure.

21. The structure of claim 20, wherein said multi-layer structure is achieved by self-assembly or layer-by-layer deposition.

22. The structure of claim 20, further comprising rare-earth doped nanocrystals.

23. The structure of claim 1, wherein said potential well is a double potential well and charge carriers of the same type are confined in two spatially distinct regions of said double potential well.

* * * * *